United States Patent [19]

Arques

[11] Patent Number: 4,554,571
[45] Date of Patent: Nov. 19, 1985

[54] MATCHED PHOTONIC DETECTOR-CHARGE TRANSFER READER ASSEMBLY AND IMAGE FORMING TARGET USING SUCH AN ASSEMBLY

[75] Inventor: Marc Arques, Paris, France

[73] Assignee: Thomson-CSF, Paris, France

[21] Appl. No.: 389,288

[22] Filed: Jun. 17, 1982

[30] Foreign Application Priority Data

Jun. 23, 1981 [FR] France ............................... 81 12296

[51] Int. Cl.$^4$ .................. H01L 29/78; H01L 27/14; H01L 31/00; G11C 19/28
[52] U.S. Cl. ........................................ 357/24; 357/30; 377/60
[58] Field of Search ................ 357/24, 30; 377/57–63; 307/311

[56] References Cited

U.S. PATENT DOCUMENTS

| | | | |
|---|---|---|---|
| 4,087,833 | 5/1978 | Tseng | 357/24 LR |
| 4,093,872 | 6/1978 | Hartman et al. | 357/24 LR |
| 4,112,316 | 9/1978 | Wentz | 357/24 LR |
| 4,150,304 | 4/1979 | Jensen | 357/24 R |
| 4,196,508 | 4/1980 | Lorenze | 357/24 LR |
| 4,443,885 | 4/1984 | van Roermund | 377/57 |

FOREIGN PATENT DOCUMENTS 0029351  5/1981  European Pat. Off. .

OTHER PUBLICATIONS

*IEEE Journal of Solid State Circuits*, vol. SC-14, No. 3, Jun. 1979 (New York), R. Koch: "Charge Injection Device with CCD Readout", pp. 604–608.
*IEEE Journal of Solid-State Circuits*, vol. SC-13, No. 1, Feb. 1978, New York.
J. T. Longo et al: "Infrared Focal Planes in Intrinsic Semiconductors", pp. 139–158.
*IEEE Transactions on Electron Devices*, vol. ED-27, No. 1, Jan. 1980, (New York).
P. Felix et al.: "CCD Readout of Infrared Hybrid Focal-Plane Arrays", pp. 175–188.

*Primary Examiner*—Gene M. Munson
*Attorney, Agent, or Firm*—Roland Plottel

[57] ABSTRACT

A photovoltaic diode input, and a charge transfer readout device are coupled by a MOS stage. The coupling stage includes a MOS transistor, to which is added, close to the source electrode of the MOS transistor which receives the signal from the diode, an extra electrode under which are stored charges which flow at the same time as those of the signal toward the readout device. Thus, the current involved is increased and the efficiency of signal injection into the readout device is improved.

5 Claims, 11 Drawing Figures

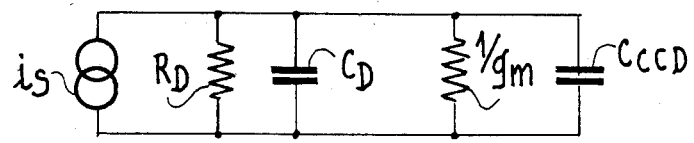
FIG_1
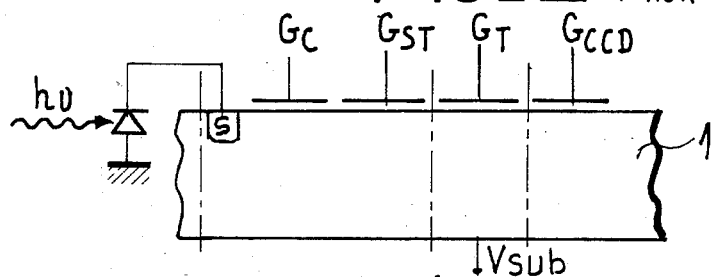
FIG_2 PRIOR ART
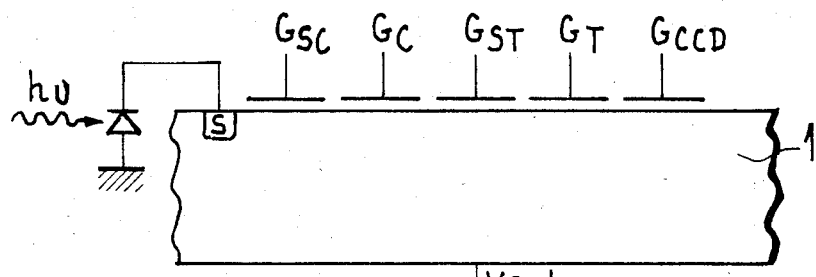
FIG_3
FIG_5
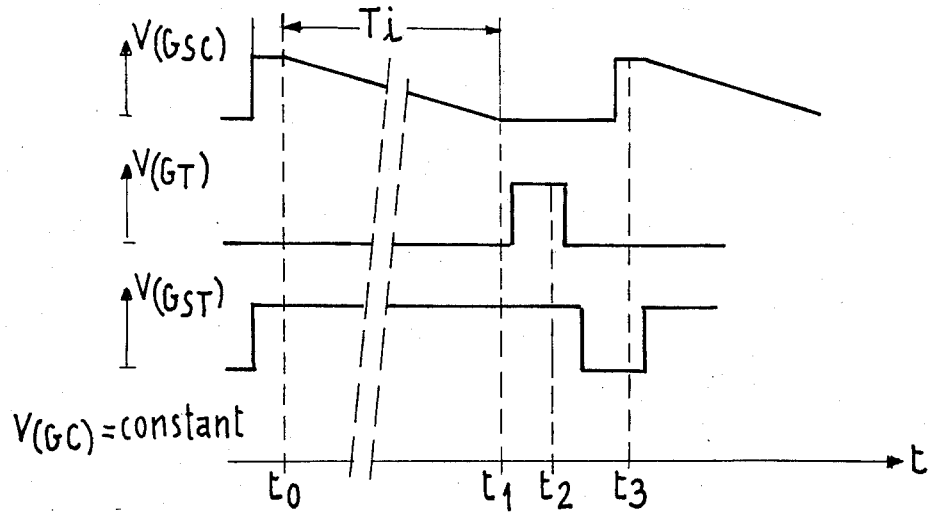

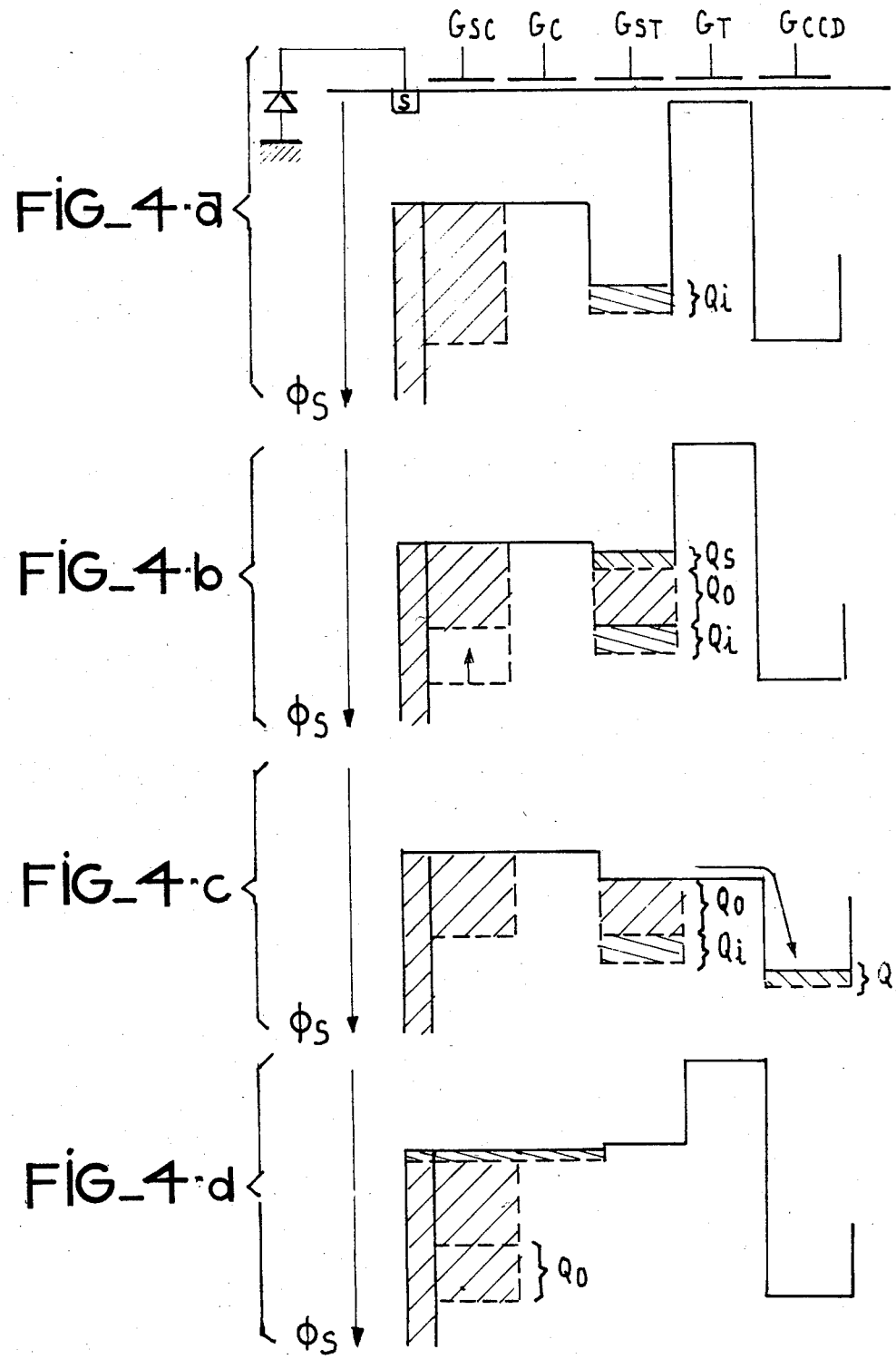

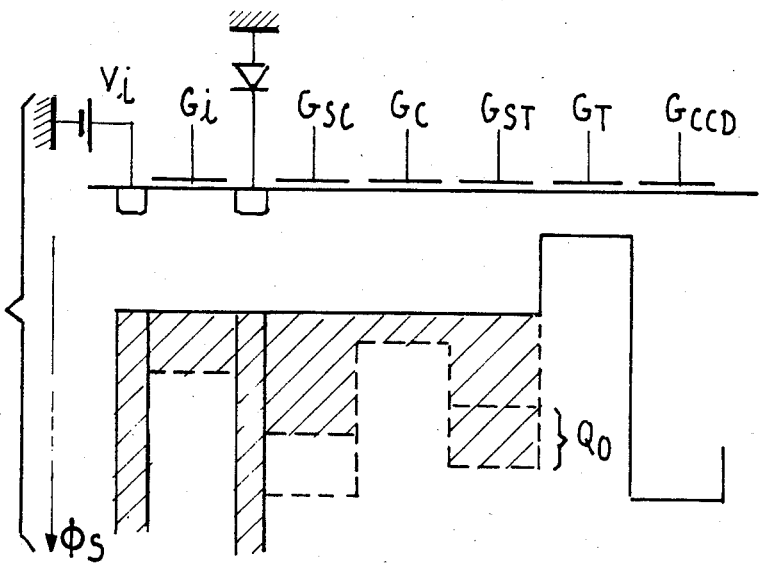
FIG_6-a
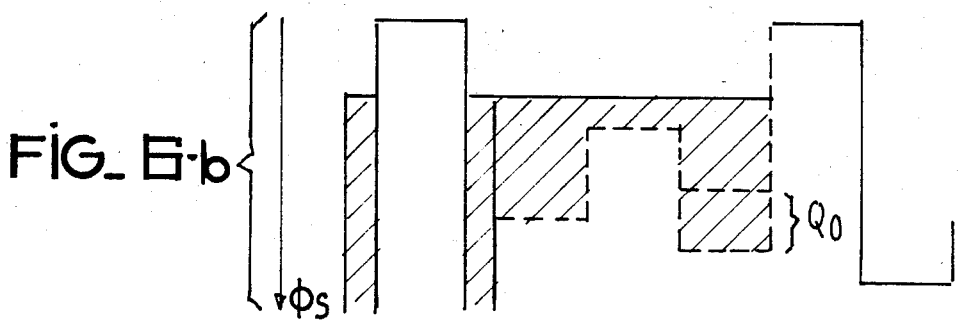
FIG_6-b
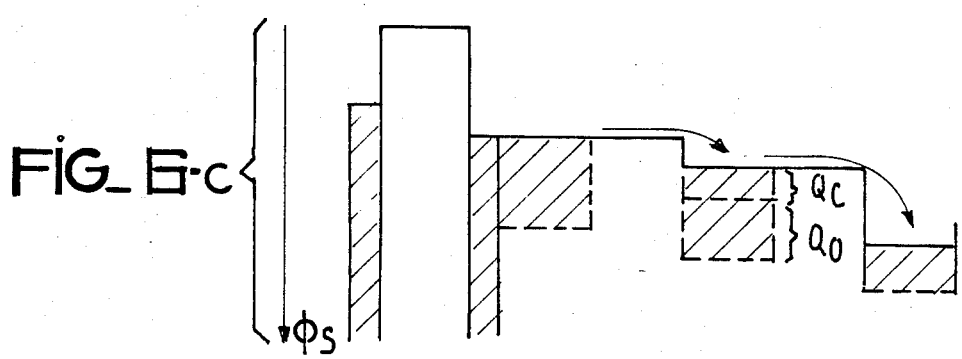
FIG_6-c

MATCHED PHOTONIC DETECTOR-CHARGE TRANSFER READER ASSEMBLY AND IMAGE FORMING TARGET USING SUCH AN ASSEMBLY

This application is related to applicant's co-pending application Ser. No. 391,485 filed on the same day as this application and having a common assignee.

BACKGROUND OF THE INVENTION

The invention relates to radiation detectors and particularly to an assembly having a radiation detector and a charge transfer readout device.

Such an assembly is used for receiving incident radiation images, particularly infra-red.

The invention relates in particular to assemblies which use solid state detectors, or sensors, which are, for example, photovoltaic diodes or photodiodes; and read out devices which are, for example, charge transfer devices such as charge coupled devices (CCD), connected together by way of an MOS transistor and a transfer gate.

In assemblies of this kind, a certain deterioration of the signal generally occurs. Experience shows that this deterioration occurs principally in the interval between the sensor and the charge transfer device. The cause is faulty injection of the signal from the photodiode into the CCD readout device. It involves the relative values of the impedances of the photodiode and the element into which its signal is injected, namely the connecting transistor between the photodiode and the readout device. This impedance mismatch occurs whatever solid material is used for constructing the diodes, usually lead tin telluride (PbSnTe) or mercury cadmium telluride (HgCdTe) or used for the charge transfer device, generally type n or p silicon.

The difficulty is well known to those skilled in the art. It is clear from the formula of the injection efficiency r which may be written:

$$r = \frac{g_m R_D}{1 + g_m R_D}$$

and which is nothing more than the distribution of the currents in an assembly of two resistances supplied in parallel with constant current—where $R_D$ is the impedance of the photodiode, and $1/g_m$, impedance of the transistor, designating by the term $g_m$, being its transconductance.

Resistance $R_D$ can hardly be modified. It is fixed in practice by the present state of technology in the field of photodiode construction from the above-mentioned materials.

As for the term $g_m$, it may be considered as being suitably represented, under the usual conditions of MOS transistors, by $$g_m = \frac{qI_s}{kT} \quad (1)$$

where q, k and T are the charge of the electron, Boltzman's constant, and the absolute temperature; and where $I_s$ represents the total signal current involved in the injection, which current comprises an alternating component $i_s$ corresponding to the variations of the signal during successive readings.

Therefore, to increase the efficiency r—essentially—only $I_s$ is available for a given operating temperature.

Arrangements have already been proposed for increasing this current, which is fixed by the operating point of the diode, by associating therewith an additional current, see: Topics in Applied Physics, vol. 38, p. 78—Charge Coupled Devices—Editor D. F. Barbe Springer Verlag Berlin, Heidelberg, New York.

The object of the invention is to provide a new structure for increasing the current $I_s$, under the conditions which will be given below.

SUMMARY OF THE INVENTION

The invention relates to a photon detector-charge transfer readout device assembly having at least one photon detector exposed to the incident radiation and readout device for reading the signals from this detector, connected together by a coupling stage having a field effect transistor (MOS) and a transfer gate. In a transfer the signals are transmitted from the detector to the readout device by sequential switching of the potentials of the electrodes of the transistor and the transfer gate. On a substrate on which the transistor is made, there is also in the vicinity of the source an additional electrode so operated that a charge accumulates thereunder, at the time when the assembly is brought into operation, part of this charge is supplied to the drain of the transistor to supplement that supplied by the source. The potential applied to this additional electrode during switching cycle is a potential which decreases steadily in time.

BRIEF DISCUSSION OF THE DRAWINGS

The invention will be better understood from the following description and the accompanying figures in which:

FIG. 1 is an equivalent electric diagram of a photodiode and its system of injection into a readout device;

FIG. 2 is a schematic representation in accordance with the prior art of the assembly, corresponding to FIG. 1;

FIG. 3 is the same basic assembly modified in accordance with the invention;

FIGS. 4(a)–4(d) are diagrams of the operation of the assembly of FIG. 3;

FIG. 5 is the corresponding timing diagram; and

FIGS. 6(a)–6(c) are diagram illustrating a variation of the invention.

DESCRIPTION OF THE PREFERRED EMBODIMENTS

FIG. 1 is an equivalent diagram of a photodiode-injection system. In this diagram are shown the quantities $R_D$ and $g_m$, already defined, as well as the capacitive components $C_D$ and $C_{CCD}$ of the photodiode and of the injection system, respectively. At low frequency, under operating conditions, the distribution of the current between the two capacitive parts is governed by the formula for efficiency r, given above, an in which these capacities play practically no part.

In this description, the usual terminology and representation used in the charge transfer field is adopted. The "potential well" notion is used, and the depth of the wells under each electrode is proportional to the surface potential under the electrode. References may be made for background information to the article by M. F. Tompsett, "Charge Transfer Devices," in J. Vac. Sci.

Technol., vol. 9, no. 4, July-August 1972, pp. 1166 to 1181; and W. S. Boyle and G. E. Smith, "Charge Coupled Semiconductor Devices," in The Bell System Technical Journal, April 1970, pp. 587 to 593.

There is shown schematically in FIG. 2 how the transition is made between a detector and a CCD readout device. This is in general representation and in accordance with the prior art. The detector is a photovoltaic diode shown in a conventional way without references. This diode receives photon radiation hν under the effect of which it generates an electric signal. The diode is formed in a substrate chosen for its sensitivity to the incident radiation, and may be made from one of the above-mentioned materials for example. The coupling stage consists of an MOS field effect transistor and a transfer gate. The letter S shows the source electrode of the MOS transistor. It may be formed, for example, by diffusion in a substrate 1 of opposite type; and preferably is an n type diffusion in a p type silicon substrate. The other electrodes of the transistor are shown at $G_C$ and $G_{ST}$ designating, respectively, the control gate and, the storage or drain-forming electrode. The signal charges are stored under the drain $G_{ST}$ injection thereof into a charge transfer or charge coupled device, whose input is the electrode marked $G_{CCD}$ preceded by a transfer gate marked $G_T$.

In the figure, the coupling region occupies the part between the two endmost broken lines. It includes the MOS transistor between the leftmost two broken lines and the transfer gate $G_T$, situated between the transistor on the left and the readout device at CCD on the right. It is in this part that there appears the efficiency r considered above.

The connection between the substrate (not shown) in which the photodiode is formed, and the substrate 1 is done by a known technique, and has not been shown.

FIG. 3 is similar to the diagram of FIG. 2, but modified by the present invention. An additional or auxiliary electrode $G_{SC}$ is applied to substrate 1. As seen, it is located between the source S and the control gate $G_c$. Its role is the creation of the additional current, discussed above, which, added to the signal current, improves the injection efficiency. It is in a sense a supplemental source adding to the charges provided by the regular source of the transistor. It is described below with reference to FIGS. 4(a, b, c, d).

It is because of this role as a source of current that the subscript SC is assigned to it.

FIG. 4 shows the successive states of the potential wells, in the coupling region and the charges contained in these wells, during a cycle for transferring the signal from the detector into the readout device. The charge transfer takes place therein as in a charge transfer device, as will be indicated.

In these figures, the potential wells are shown, conventionally, by steps along the axis of the potentials, positively orientated downwards. Broken lines are used to show what the potential of these wells would be in the absence of charges. The presence of charges is indicated by hatching. $\emptyset_S$ is the surface potential under the electrode considered.

At the beginning of a cycle, i.e., at the time $t=t_o$, the states of the various wells are shown in FIG. 4(a).

The narrow hatched column on the left of the figure represents the quantity of charges supplied from the diode to source S, constantly maintained, as can be seen, at the high level of the potential of the well under the gate $G_C$. The charges injected from the diode pass to the potential well under $G_{SC}$. A small quantity of charge, shown at $Q_i$, is present in the well of the electrode $G_{ST}$. We will come back to this quantity $Q_i$ further on.

During the integration period $T_i$ which follows, there is applied to auxiliary electrode $G_{SC}$ a voltage ramp, i.e., a voltage which steadily decreases in time (in accordance with a law which may be linear). With the voltage on $G_{SC}$ diminishing (arrow of FIG. 4(b)), the well under this electrode is partially emptied of the charges which it contains. These charges then move past $G_C$ to the storage electrode $G_{ST}$. An additional current $I_o$ is created by the flow of these charges, designated by $Q_o$ in the figure. This current is added to the signal current $I_s$ in the expression (1) of the transconductance $g_m$, which is therefore increased and possibly substantially so. The quantity $Q_o$ may be of the order of the quantity of charges $Q_S$ of the signal, or several times greater. It will be noted that, in the case of the linear law, the additional current is practically constant during the whole integration period. This is because the capacity under electrode $G_{SC}$ remains constant during this period, since the surface potential under this electrode is fixed by the potential of gate $G_C$, and which is maintained constant during the whole cycle, as shown in the diagrams of FIGS. 4.

At the end of the integration period $T_i$, the situation is the one shown in FIG. 4(b) where, under the storage electrode $G_{ST}$ are the charges $Q_i$, $Q_S$ and $Q_o$.

At time $t_2$, shortly after the end of the integration period, signal the charge $Q_S$ is transferred past gate $G_T$ to the input electrode $G_{CCD}$ (arrow) of the charge transfer device, FIG. 4(c). During this phase, the high potential of gate $G_T$ is such that the signal charge $Q_S$, and it alone, is transferred to the well under electrode $G_{CCD}$. This transfer is to the exclusion of any fraction of charge $Q_o$. Charge $Q_i$ is such that the sum of the charges $Q_o$ and $Q_i$ then just fills the storage well under electrode $G_{ST}$. Then in the next phase the channel under $G_T$ is blocked; the potential is reduced under $G_{ST}$; and the potential of $G_{SC}$ is again given the value that it had at the top of the voltage ramp, at time $t_o$. This results in bringing charge $Q_o$ under electrode $G_{SC}$; and the situation is the one shown in FIG. 4(d), at time $t_3$. The charge $Q_i$ is then distributed under electrode $G_{SC}$, $G_C$ and possibly $G_{ST}$, as shown in FIG. 4(d) by the small horizontal rectangle covered with close hatching. Finally, the potential of electrode $G_{ST}$ is raised to return to the conditions at initial time $t_o$, before the next cycle, and so on.

To make things clearer, there is shown in FIG. 5 an example of the timing diagram corresponding to the cycle described. In this figure, the axes of voltages V are orientated, this time, positively upwards. The diagram has constant control gate voltage $V_{GC}$. The axis of time has been cut so as to respect the proportions between the integration times marked $T_i$, and the duration of the end of the cycle, between $t_1$ and $t_3$, which is a small fraction of the period $T_i$, of the order of a tenth to a hundredth.

In summary, the invention uses an additional charge quantity $Q_o$ for improving the injection into the charge transfer device. Earlier mention was made of another quantity $Q_i$, the purpose of which has not yet been explained. In fact, if the device only has a single detector, i.e., a single photodiode and a single reader, such a charge $Q_i$ is not necessary. It is quite different when several photodiodes and their readout devices are used, for example, if there is an image forming assembly, with several diodes and readout devices and disposed in a mosaic in the detector substrate, or only on strips, as may be the case in the present state of target technology. In general, the coupling stages are then controlled all at the same time, or in groups, by common voltages applied to their electrodes. This is the case particularly for transfer gates $G_T$, but, since the threshold potentials of these gates are not all the same, for a given applied voltage, their surface potentials are different and the strict transfer of just quantities $Q_S$ according to FIG. 4(c) is not ensured for all the transitions. It is to remedy this state of affairs that the preferred form of the invention provides for introducing an initial charge, the charge $Q_i$ under the storage electrodes $G_{ST}$ of each detector-readout assembly, having an appropriate value applied to each of them.

In all cases, the quantity of charge $Q_i$ is obtained from the signal charges of the photodiodes, accumulated under $G_{SC}$ and $G_{ST}$ in a preliminary phase, during which the photodiode is maintained exposed to the radiation without proceeding with transfer of its signals to the reader. Charge $Q_i$ is generally small, of the order of $Q_S$ or a little greater, as shown.

The procedure is the same for quantity $Q_o$, which is substantially greater than the other quantities. This charge is the same for all the detector-reader assemblies.

In a variation of the invention, an additional P-type zone is used to form a diode D in substrate 1, associated with a gate $G_i$ and connected to a voltage source $V_i$, as shown in the drawing of FIG. 6. Gate G occupies a position adjacent one of the source S of the preceding figures (or several of them). This arrangement protects the photodiode against possible over-voltages when it is brought into operation.

The compensation takes place as follows in accordance with the diagram of FIGS. 6(a), 6(b), 6(c).

In a first stage, the potentials on $G_{SC}$ and $G_T$ are brought to the low level, the potential on $G_{ST}$ being at the high level. Potential $V_i$ is imposed as surface potential under $G_i$, $G_{SC}$, $G_{ST}$ and S, by applying a high voltage to $G_i$ (FIG. 6(a)).

In a second stage, $S_1$, $G_{SC}$, $G_C$ and $G_{ST}$ are isolated from voltage $V_i$ by applying a low voltage to $G_i$ (FIG. 6(b)).

In a third stage, the high voltage is applied to $G_T$. This voltage must be such that the storage well under $G_{ST}$ may then contain a charge greater than $Q_o$. A part of the charge is removed under $G_{CCD}$ (arrows). We then obtain the situation shown in FIG. 6(c). The situation under $S_1$, $G_{SC}$, $G_C$, $G_{ST}$ and $G_T$ is the same as in FIG. 4(c). The charge $Q_o+Q_i$ is available under $G_{ST}$. Normal operating conditions are provided.

It is also possible, in another variation of the diagram of FIG. 3, to add an additional electrode between source S and auxiliary electrode $G_{SC}$, which isolates diode S from the rest of the transition stage while charge $Q_o$ returns from the storage electrode $G_{ST}$ to electrode $G_{SC}$, between times $t_2$ and $t_3$.

It will finally be noted that the invention, described in the case of auxiliary electrode $G_{SC}$ placed between the source S and the control electrode $G_C$, may be transposed to the case where the electrode $G_{SC}$ is situated on the side opposite to $G_C$ with respect to this source. In this case, the charges accumulated under $G_{SC}$ would follow without difficulty the same progression under the different electrodes after having passed the constant potential under S.

For the sake of clearness, the electrodes have been shown coplanar in the drawings and without overlapping therebetween. Such overlapping may be necessary in practice; and they might also not be coplanar.

Other variations, and in particular to those described, accessible to a man skilled in the art, are also included in the invention.

The structure of the invention is readily fabricated, since integration in the substrate of the additional electrode $G_{SC}$ does not pose any problem in the present state of the technology. The role of current source which it plays avoids introducing external charges for creating the additional current. The threshold voltage variations of transfer gate $G_T$ has no influence on this source.

The invention finds an application in the construction of infra-red image-forming targets.

What is claimed is:

1. In a photon detector-charge transfer readout device assembly comprising at least one photon detector exposed to incident radiation and a readout device for reading a signal from this detector, transfer charges created in the readout device being of the same sign to those of the signal of the detector, detector and said readout device being connected together by way of a MOS field effect transister having a source, an auxiliary electrode, a control gate, a drain-forming electrode and a transfer gate, said MOS transistor being integrated with the readout device, the signals from the detector being transmitted to the readout device by sequential switching of the potentials of the electrodes of the transister, said auxiliary electrode being adjacent the source for accumulating thereunder in said substrate during operation a fixed reserve charge, and means for applying a steadily decreasing potential in time to this additional electrode during a switching cycle.

2. The assembly as claimed in claim 1, comprising at least two such detectors and two such transistors whose electrodes are controlled by the same potentials, further comprising means for accumulating under the electrode forming drain of each transistor, at the time when the assembly is brought into operation, another charge quantity compensating for the inequality of potentials in the substrate under the transfer gate brought to the same potential.

3. The assembly as claimed in claim 1 wherein said detector is a photovoltaic diode.

4. The assembly as claimed in claim 1, wherein the potential applied to said additional electrode decreases linearly in time.

5. The assembly of claim 1 for use in an image forming target.

* * * * *